(12) United States Patent
Ishikawa et al.

(10) Patent No.: US 7,656,927 B2
(45) Date of Patent: Feb. 2, 2010

(54) OPTICAL SEMICONDUCTOR ELEMENT AND OPTICAL SEMICONDUCTOR DEVICE

(75) Inventors: Tsutomu Ishikawa, Yamanashi (JP); Takuya Fujii, Yamanashi (JP)

(73) Assignee: Eudyna Devices Inc., Yamanashi (JP)

( * ) Notice: Subject to any disclaimer, the term of this patent is extended or adjusted under 35 U.S.C. 154(b) by 0 days.

(21) Appl. No.: 12/314,350

(22) Filed: Dec. 9, 2008

(65) Prior Publication Data

US 2009/0103585 A1 Apr. 23, 2009

Related U.S. Application Data

(62) Division of application No. 11/730,260, filed on Mar. 30, 2007, now Pat. No. 7,474,684.

(30) Foreign Application Priority Data

Mar. 31, 2006 (JP) ............................. 2006-100351

(51) Int. Cl.
*H01S 3/03* (2006.01)
(52) U.S. Cl. .................... 372/64; 372/34; 372/50.11
(58) Field of Classification Search .............. 372/64, 372/50.11

See application file for complete search history.

(56) References Cited

U.S. PATENT DOCUMENTS

2002/0090011 A1* 7/2002 Pezeshki et al. ............... 372/20
2003/0006225 A1* 1/2003 Choa .......................... 219/210

FOREIGN PATENT DOCUMENTS

JP 9-92934 A 4/1997

* cited by examiner

*Primary Examiner*—Dung T Nguyen
(74) *Attorney, Agent, or Firm*—Westerman, Hattori, Daniels & Adrian, LLP

(57) ABSTRACT

An optical semiconductor device includes an optical semiconductor element, a metal pattern and at least one thermal conductive material. The optical semiconductor element has a first optical waveguide region and a second optical waveguide region. The second optical waveguide region is optically coupled to the first optical waveguide region and has a heater for changing a refractive index of the second optical waveguide region. The metal pattern is provided on an area to be thermally coupled to a temperature control device. The thermal conductive material couples the metal pattern with an upper face of the first optical waveguide region of the optical semiconductor element. The thermal conductive material is electrically separated from the first optical waveguide region.

2 Claims, 8 Drawing Sheets

OPTICAL SEMICONDUCTOR ELEMENT AND OPTICAL SEMICONDUCTOR DEVICE

CROSS-REFERENCE TO RELATED APPLICATION

This application is a Divisional application of U.S. patent application Ser. No. 11/730,260, filed Mar. 30, 2007, the entire contents of which are hereby incorporated by reference.

BACKGROUND OF THE INVENTION

1. Field of the Invention

This invention generally relates to an optical semiconductor element and an optical semiconductor device.

2. Description of the Related Art

Generally, a wavelength-tunable semiconductor laser has a gain for a laser emission and can select a wavelength of the laser. There are some methods of selecting a wavelength. For example, the methods include a method of changing a resonant wavelength of loss or gain by changing a refractive index or angle of a diffractive grating or an etalon provided in a laser cavity. And the methods include a method of changing a resonant wavelength of the laser cavity by changing an optical length in the laser cavity (refractive index or a physical length of the laser cavity).

The method of changing the refractive index has an advantage in reliability or manufacturing cost, because a mechanical operating portion is not necessary being different from the method of changing the angle or length. The refractive index changing method includes changing a temperature of an optical waveguide, changing a carrier density in the optical waveguide by providing a current, and so on. A semiconductor laser having a Sampled Grating Distributed Reflector (SG-DR) is supposed as a wavelength tunable semiconductor laser that changes a temperature of an optical waveguide, where the SG-DR has a wavelength selection function.

In this semiconductor laser, if a reflection spectrum of a plurality of SG-DR regions (reflection region) is controlled preferably, a predetermined wavelength can be selected with a vernier effect. That is, this semiconductor laser emits a laser at a wavelength where reflection peaks of two SG-DR regions are overlapped with each other. It is therefore possible to select the lasing wavelength by controlling each of the reflection peaks of the SG-DR regions.

Generally, a heater is provided on a surface of one of the SG-DR regions. It is possible to change the temperature of an optical waveguide of the SG-DR region where the heater is provided, with heat generated by the heater. As a result, a refractive index of the optical waveguide is changed. Accordingly, it is possible to select a reflection peak wavelength of the SG-DR region where the heater is provided, by controlling the heating value of the heater.

And it is possible to control the lasing wavelength to be a desirable one by controlling the refractive index of the optical waveguide of the SG-DR segments, with use of a temperature control device providing heat to whole of a semiconductor laser. And so, Japanese Patent Application Publication No. 9-92934 (hereinafter referred to as Document 1) discloses a method of controlling a lasing wavelength of the semiconductor laser by providing an electrical power to a heater and a temperature control device separately.

However, it is apprehended that the temperature of an SG-DR region not having a heater is changed, when heating value of the heater is large. In this case, the lasing wavelength is off from a desirable one. In the semiconductor laser disclosed in Document 1, an active region (a gain region) and a DBR region (a reflecting region) having a heater are adjacent to each other. As is the case of the conventional art, if the heating value of the heater is large, the temperature of the active region not having the heater is changed. Therefore, the lasing wavelength is off from a desirable one in the semiconductor laser disclosed in Document 1.

SUMMARY OF THE INVENTION

The present invention provides an optical semiconductor element and an optical semiconductor device that can control a lasing wavelength accurately.

According to an aspect of the present invention, preferably, there is provided an optical semiconductor device including an optical semiconductor element, a metal pattern and at least one thermal conductive material. The optical semiconductor element has a first optical waveguide region and a second optical waveguide region. The second optical waveguide region is optically coupled to the first optical waveguide region and has a heater for changing a refractive index of the second optical waveguide region. The metal pattern is provided on an area to be thermally coupled to a temperature control device. The thermal conductive material couples the metal pattern with an upper face of the first optical waveguide region of the optical semiconductor element. The thermal conductive material is electrically separated from the first optical waveguide region.

With the above-mentioned configuration, heat is conducted to the first optical waveguide region through the thermal conductive material from the metal pattern that is provided on the area to be thermally coupled to the temperature control device. In this case, the first optical waveguide region is heated from a connecting point with the thermal conductive material and from the area to be thermally coupled to the temperature control device. It is therefore possible to control the temperature of the first optical waveguide region effectively in the optical semiconductor device, being less subjected to the heat of the heater. Accordingly, it is possible to control a lasing wavelength.

According to another aspect of the present invention, preferably, there is provided an optical semiconductor device including an optical semiconductor element, a metal pattern and at least one thermal conductive material. The optical semiconductor element has a first optical waveguide region and a second optical waveguide region. The second optical waveguide region is optically coupled to the first optical waveguide region and has a heater for changing a refractive index of the second optical waveguide region. The metal pattern is provided on an area to be thermally coupled to a temperature control device. The thermal conductive material couples the metal pattern with an upper face of the first optical waveguide region of the optical semiconductor element. The thermal conductive material is electrically coupled to the first optical waveguide region.

With the above-mentioned configuration, heat is conducted to the first optical waveguide region through the thermal conductive material from the metal pattern that is provided on the area to be thermally coupled to the temperature control device. In this case, the first optical waveguide region is heated from a connecting point with the thermal conductive material and from the area to be thermally coupled to the temperature control device. It is therefore possible to control the temperature of the first optical waveguide region effectively in the optical semiconductor device, being less subjected to the heat of the heater. Accordingly, it is possible to control a lasing wavelength.

According to another aspect of the present invention, preferably, there is provided an optical semiconductor device including an optical semiconductor element, a metal pattern and a plurality of thermal conductive material. The optical semiconductor element has a first optical waveguide region and a second optical waveguide region. The second optical waveguide region is optically coupled to the first optical waveguide region and has a heater for changing a refractive index of the second optical waveguide region. The metal pattern is provided on an area to be thermally coupled to a temperature control device. The thermal conductive material couples the metal pattern with an upper face of the first optical waveguide region of the optical semiconductor element. The thermal conductive material is electrically coupled to the first optical waveguide region.

With the above-mentioned configuration, heat is conducted to the first optical waveguide region through the thermal conductive material from the metal pattern that is provided on the area to be thermally coupled to the temperature control device. In this case, the first optical waveguide region is heated from a connecting point with the thermal conductive material and from the area to be thermally coupled to the temperature control device. It is therefore possible to control the temperature of the first optical waveguide region effectively in the optical semiconductor device, being less subjected to the heat of the heater. Accordingly, it is possible to control a lasing wavelength.

According to another aspect of the present invention, preferably, there is provided an optical semiconductor device including an optical semiconductor element, a metal pattern and at least one thermal conductive material. The optical semiconductor element has a first optical waveguide region and a second optical waveguide region. The second optical waveguide region is optically coupled to the first optical waveguide region and has a heater for changing a refractive index of the second optical waveguide region. The metal pattern is provided on an area to be thermally coupled to a temperature control device. The thermal conductive material couples the metal pattern with an upper face of the first optical waveguide region of the optical semiconductor element. The thermal conductive material is at the second optical waveguide region side with respect to a center of the first optical waveguide region.

With the above-mentioned configuration, heat is conducted to the first optical waveguide region through the thermal conductive material from the metal pattern that is provided on the area to be thermally coupled to the temperature control device. In this case, the first optical waveguide region is heated from a connecting point with the thermal conductive material and from the area to be thermally coupled to the temperature control device. It is therefore possible to control the temperature of the first optical waveguide region effectively in the optical semiconductor device, being less subjected to the heat of the heater. Accordingly, it is possible to control a lasing wavelength.

According to another aspect of the present invention, preferably, there is provided an optical semiconductor element including a first optical waveguide region, a second optical waveguide region and a metal pattern. The second optical waveguide region is optically coupled to the first optical waveguide region and has a heater for changing a refractive index of the second optical waveguide region. The metal pattern is provided on an upper face of the first optical waveguide region and has a length larger than half of that of the first optical waveguide region in an optical axis direction of the first optical waveguide region.

With the above-mentioned configuration, heat is conducted to the first optical waveguide region from a heating portion such as a temperature control device when the metal pattern is thermally coupled to the heating portion. In this case, the first optical waveguide region is heated from the connecting points and the heating portion. It is therefore possible to control the temperature of the first optical waveguide region effectively in the optical semiconductor element, being less subjected to the heat of the heater. Accordingly, it is possible to control a lasing wavelength accurately. In addition, it is possible to conduct heat to the first optical waveguide region effectively because the metal pattern has a large length.

According to another aspect of the present invention, preferably, there is provided an optical semiconductor element including a first optical waveguide region, a second optical waveguide region and a metal pattern. The second optical waveguide region is optically coupled to the first optical waveguide region and has a heater for changing a refractive index of the second optical waveguide region. The metal pattern is provided on an upper face of the first optical waveguide region at the second optical waveguide region side with respect to a center of the first optical waveguide region.

With the above-mentioned configuration, heat is conducted to the first optical waveguide region from a heating portion such as a temperature control device when the metal pattern is thermally coupled to the heating portion. In this case, the first optical waveguide region is heated from the connecting points and the heating portion. It is therefore possible to control the temperature of the first optical waveguide region effectively in the optical semiconductor element, being less subjected to the heat of the heater. Accordingly, it is possible to control a lasing wavelength accurately. In addition, it is possible to control the temperature of an area of the first optical waveguide region subjected to the heat of the heater.

BRIEF DESCRIPTION OF THE DRAWINGS

Preferred embodiments of the present invention will be described in detail with reference to the following drawings, wherein.

DESCRIPTION OF THE PREFERRED EMBODIMENTS

A description will now be given, with reference to the accompanying drawings, of embodiments of the present invention.

First Embodiment

Figure 1A:
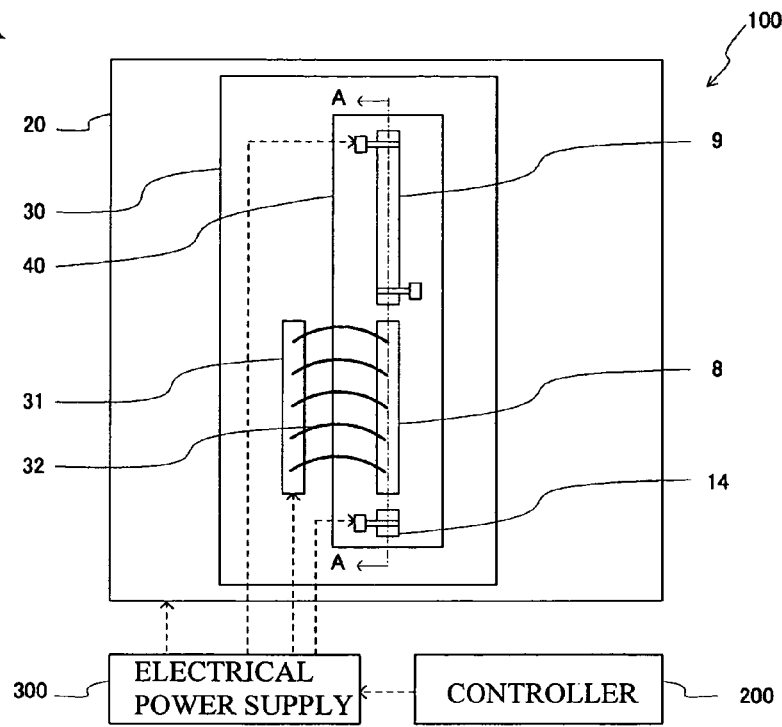
FIG. 1A and FIG. 1B illustrate a laser module in accordance with a first embodiment of the present invention.
Figure 1B:
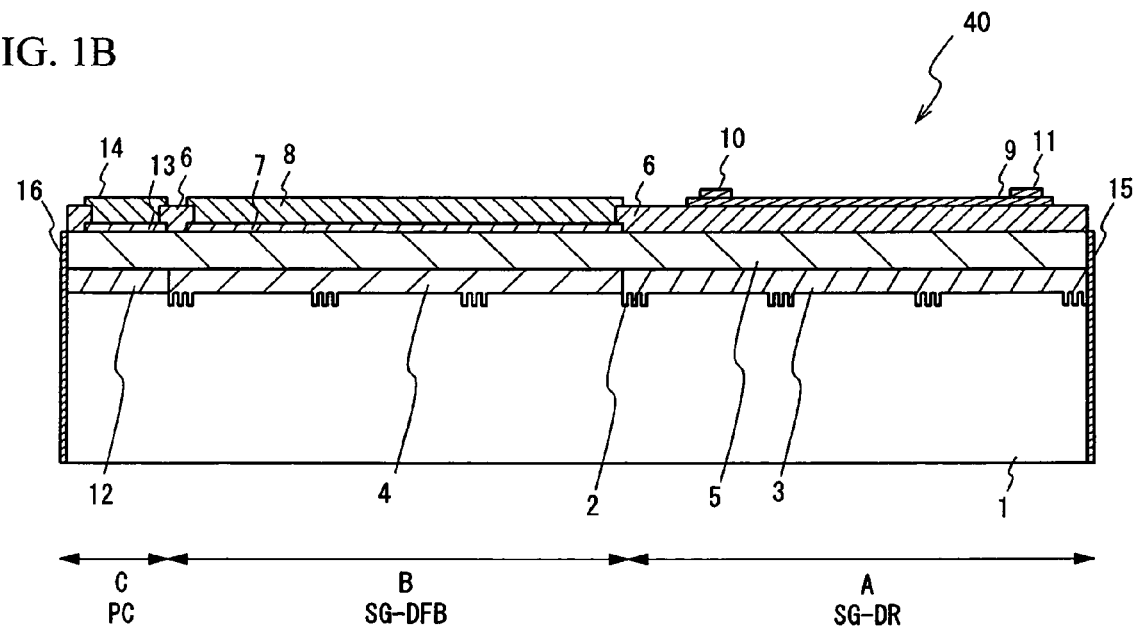

FIG. 1A and FIG. 1B illustrate a laser module 100 in accordance with a first embodiment of the present invention. FIG. 1A illustrates a top view of the laser module 100. FIG. 1B illustrates a cross sectional view taken along a line A-A of FIG. 1A. As shown in FIG. 1A, the laser module 100 has a temperature control device 20, a mount carrier 30 and a wavelength-tunable semiconductor laser chip 40. The mount carrier 30 may be a heat sink, a subcarrier, a submount or the like. A controller 200 and an electrical power supply 300 are provided out of the laser module 100. The controller 200 controls an operation of the laser module 100. The electrical power supply provides an electrical power to the laser module 100. The controller 200 has a central processing unit (CPU), a read only memory (ROM), a random access memory (RAM) and so on. The laser module 100, the controller 200 and the electrical power supply 300 are collectively referred to as a laser device.

The temperature control device 20 controls the temperature of the wavelength-tunable semiconductor laser chip 40. The temperature control device 20 is coupled to the electrical power supply 300 through a control terminal or the like (not shown). The temperature control device 20 controls the temperature of the wavelength-tunable semiconductor laser chip 40 by changing the temperature of the surface thereof according to an electrical power provided from the electrical power supply 300. The mount carrier 30 is mounted on the temperature control device 20. An electrode 31 and the wavelength-tunable semiconductor laser chip 40 are mounted on the mount carrier 30.

The electrode 31 is a metal pattern composed of a metal such as Au. An electrode 8 of the wavelength-tunable semiconductor laser chip 40 and the electrode 31 are coupled to each other with a plurality of wires 32. The wire 32 is composed of a metal such as Au. The wire 32 has a diameter of approximately 20 μm. The electrode 31 is coupled to the electrical power supply 300 through a control terminal or the like (not shown).

As shown in FIG. 1B, the wavelength-tunable semiconductor laser chip 40 has a structure in which a Sampled Grating Distributed Reflector (SG-DR) region A, a Sampled Grating Distributed Feedback (SG-DFB) region B and a Power Control (PC) region C are coupled in order.

The SG-DR region A has a structure in which an optical waveguide layer 3, a cladding layer 5 and an insulating layer 6 are laminated on a substrate 1 in order and a heater 9, a power electrode 10 and a ground electrode 11 are laminated on the insulating layer 6. The SG-DFB region B has a structure in which an optical waveguide layer 4, the cladding layer 5, a contact layer 7 and the electrode 8 are laminated on the substrate 1 in order. The PC region C has a structure in which an optical waveguide layer 12, the cladding layer 5, a contact layer 13 and an electrode 14 are laminated on the substrate 1 in order. The substrate 1 and the cladding layer 5 of the SG-DR region A, the SG-DFB region B and the PC region C are a single layer formed as a unit respectively. The optical waveguide layers 3, 4 and 12 are formed on a same plane and are optically coupled to each other.

A low reflecting coating 15 is formed on end facet of the substrate 1, the optical waveguide layer 3 and the cladding layer 5 at the SG-DR region A side. On the other hand, a low reflecting coating 16 is formed on end facet of the substrate 1, the optical waveguide layer 12 and the cladding layer 5 at the PC region C side. Diffractive gratings 2 are formed at an interval in the optical waveguide layers 3 and 4. The sampled grating is thus formed. The insulating layer 6 is further formed between the electrode 8 and the electrode 14.

The substrate 1 is, for example, a semiconductor substrate composed of InP. The optical waveguide layer 3 is, for example, composed of InGaAsP crystal having an absorption edge wavelength at shorter wavelengths side compared to the lasing wavelength. PL wavelength of the optical waveguide layer 3 is approximately 1.3 μm. The optical waveguide layer 4 is, for example, an active layer composed of InGaAsP crystal for amplifying a light of a desirable wavelength of a laser emission. The PL wavelength of the optical waveguide layer 4 is approximately 1.57 μm. The optical waveguide layer 12 is, for example, composed of InGaAsP crystal for changing the output of the emitted light by absorbing or amplifying a light. The PL wavelength of the optical waveguide layer 12 is approximately 1.57 μm.

SG-DR segments are formed in the optical waveguide layer 3. Other SG-DR segments are formed in the optical waveguide layer 4. Three SG-DR segments are formed in the optical waveguide layer 3 and in the optical waveguide layer 4 respectively, in the embodiment. Here, the SG-DR segment is a region in which one region having the diffractive grating 2 and one space region not having the diffractive grating 2 are combined in the optical waveguide layers 3 and 4.

The cladding layer 5 is composed of InP. The cladding layer 5 confines a laser light traveling in the optical waveguide layers 3, 4 and 12. The contact layers 7 and 13 are composed of InGaAsP crystal. The insulating layer 6 is a passivation film composed of an insulator such as SiN. The low reflecting coatings 15 and 16 are, for example, composed of a dielectric film including $MgF_2$ and TiON. The reflectivity of the low reflecting coatings 15 and 16 are, for example, less than 0.3%.

The heater 9 is composed of such as NiCr and is provided above the SG-DR segment of the optical waveguide layer 3. The power electrode 10 and the ground electrode 11 are coupled to the heater 9. The power electrode 10, the ground electrode 11, the electrode 8 and the electrode 14 are composed of a conductive material such as Au. The power electrode 10 and the electrode 14 are coupled to the electrical power supply 300 through a control terminal or the like (not shown).

Next, a description will be given of a controlling method of the laser module 100. At first, the controller 200 controls the electrical power supply 300 so that a current is provided to the electrode 8 through the electrode 31 and the wires 32. A light is generated in the optical waveguide layer 4. And the controller 200 controls the electrical power supply 300 so that a current is provided to the electrode 14. The light propagates in the optical waveguide layers 3 and 4, and is reflected and amplified repeatedly. Then, it causes lasing oscillation. A part of the emitted light is amplified or absorbed in the optical waveguide layer 12 and is emitted through the low reflecting coating 16. It is possible to control the gain or the absorptance of the optical waveguide layer 12 with the current provided to the electrode 14. The controller 200 can keep the output of the emitted light of the wavelength-tunable semiconductor laser chip 40 constant by controlling the current to be provided to the electrode 14.

The controller 200 controls the electrical power supply 300 so that a current is provided to the heater 9. The controller 200 can control the temperature of the SG-DR segment of the SG-DR region A according to the current to be provided to the heater 9. In this case, the refractive index of the SG-segment of the SG-DR region A is changed. And a reflection peak wavelength of the optical waveguide layer 3 is changed. Accordingly, a laser light is emitted at a wavelength where the reflection peak wavelength of the SG-DR region A and the reflection peak wavelength of the SG-DFB region B are overlapped to each other. That is, it is possible to select a lasing wavelength of the wavelength-tunable semiconductor laser chip 40.

The controller 200 controls the electrical power supply 300 so that a current is provided to the temperature control device 20. The controller 200 can control both temperatures of the optical waveguide layer 3 and the optical waveguide layer 4 according to the current to be provided to the temperature control device 20. In this case, the refractive index of the optical waveguide layers 3 and 4 is changed. And both of the reflection peak wavelengths of the optical waveguide layers 3 and 4 are changed. It is therefore possible to control the lasing wavelength of the wavelength-tunable semiconductor laser chip 40. Accordingly, it is possible to control the lasing wavelength of the wavelength-tunable semiconductor laser chip 40 by controlling the current provided to the heater 9 and the temperature control device 20.

The temperature of the surface of the temperature control device 20 is substantially equal to that of the electrode 31 provided on the mount carrier 30, because the mount carrier 30 is mounted on the temperature control device 20. The heat generated in the temperature control device 20 is thus conducted to the electrode 8 from the electrode 31 through the wires 32. And the heat is conducted to the optical waveguide layer 4 from the electrode 8. The optical waveguide layer 4 is heated from upper side and lower side thereof. Therefore, the temperature control device 20 can control the temperature of the optical waveguide layer 4 to be substantially constant. The temperature control device 20 can control the temperature of the optical waveguide layer 4 effectively, being less subjected to the heat of the heater 9.

It is preferable that connecting points between the wires 32 and the electrode 8 are at a substantially equal interval on the overall of the electrode 8, because the thermal conductivity to the electrode 8 is improved in this case. It is preferable that the number of the wire 32 is larger.

In the embodiment, the wavelength-tunable semiconductor laser chip 40 corresponds to the optical semiconductor element. The mount carrier 30 corresponds to the area to be thermally conducted to the temperature control device. The wire 32 corresponds to the thermal conductive material. The SG-DFB region B corresponds to the first optical waveguide region. The SG-DR region A corresponds to the second optical waveguide region. The electrode 31 corresponds to the metal pattern. The area where the sampled diffractive grating 2 is formed in the optical waveguide layers 3 and 4 corresponds to the first region. The space region not having the sampled diffractive grating 2 corresponds to the second region.

Second Embodiment

Figure 2:
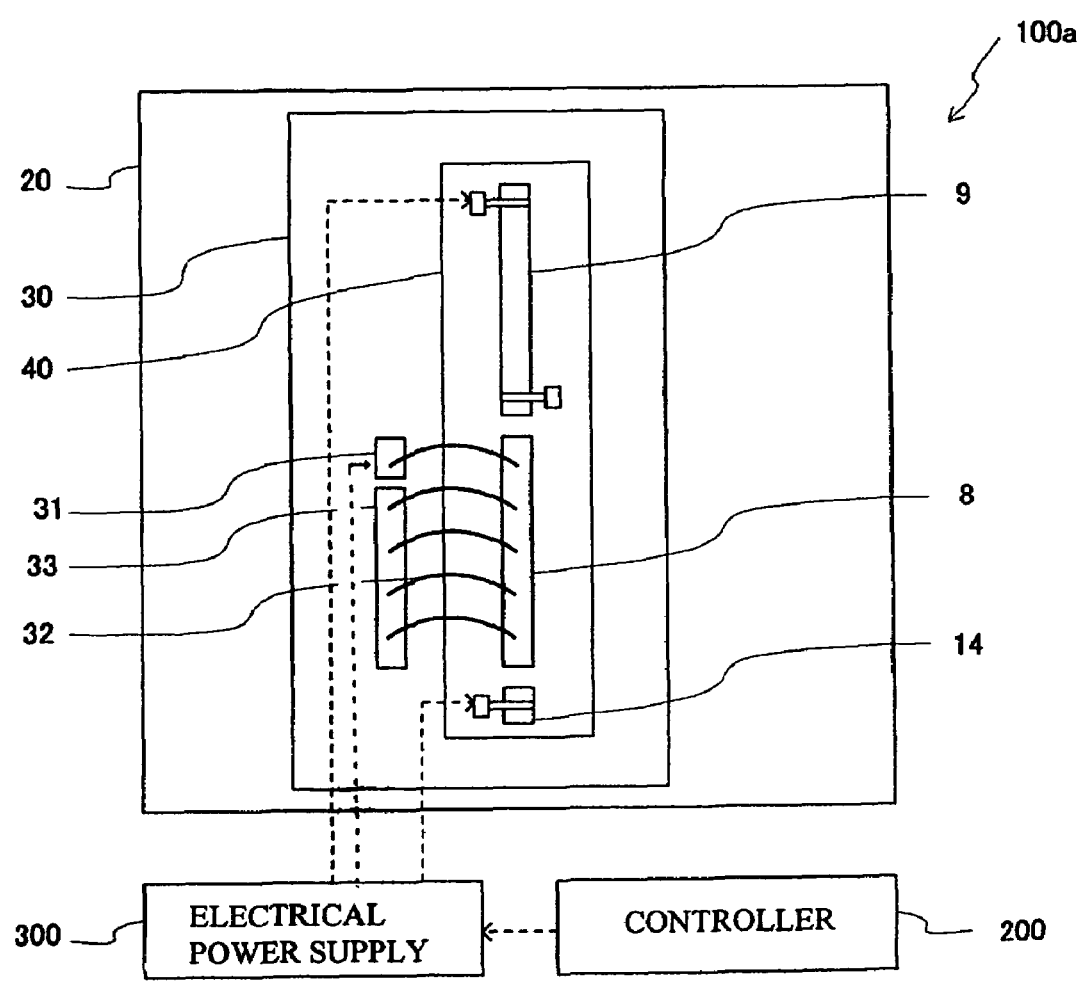
FIG. 2 illustrates an overall structure of a laser module in accordance with a second embodiment of the present invention.

Next, a description will be given of a laser module 100a in accordance with a second embodiment of the present invention. FIG. 2 illustrates an overall structure of the laser module 100a. As shown in FIG. 2, the laser module 100a differs from the laser module shown in FIG. 1A and FIG. 1B in a point that a thermal conductive portion 33 is provided on the mount carrier 30. The same components have the same reference numerals in order to avoid a duplicated explanation.

The thermal conductive portion 33 is composed of a material having a high thermal conductivity. The thermal conductive portion 33 may be composed of a conductive material or an insulating material. In the embodiment, the thermal conductive portion 33 is composed of a material such as Au. The thermal conductive portion 33 is not coupled to the electrical power supply 300. The thermal conductive portion 33 does not provide electrical power to the electrode 8 but provides heat to the electrode 8. The electrode 31 is coupled to the electrode 8 with at least one wire 32. The thermal conductive portion 33 is coupled to the electrode 8 with at least one wire 32.

In the embodiment, the heat is conducted to the electrode 8 from the electrode 31 and the thermal conductive portion 33 through the wires 32. The temperature control device 20 can control the temperature of the optical waveguide layer 4 effectively. The wires 32 may not provide an electrical power to the electrode 8. The effect of the present invention is obtained when the wire 32 conducts the heat generated in the temperature control device 20 to the electrode 8.

In the embodiment, the thermal conductive portion 33 corresponds to the metal pattern.

Third Embodiment

Figure 3:
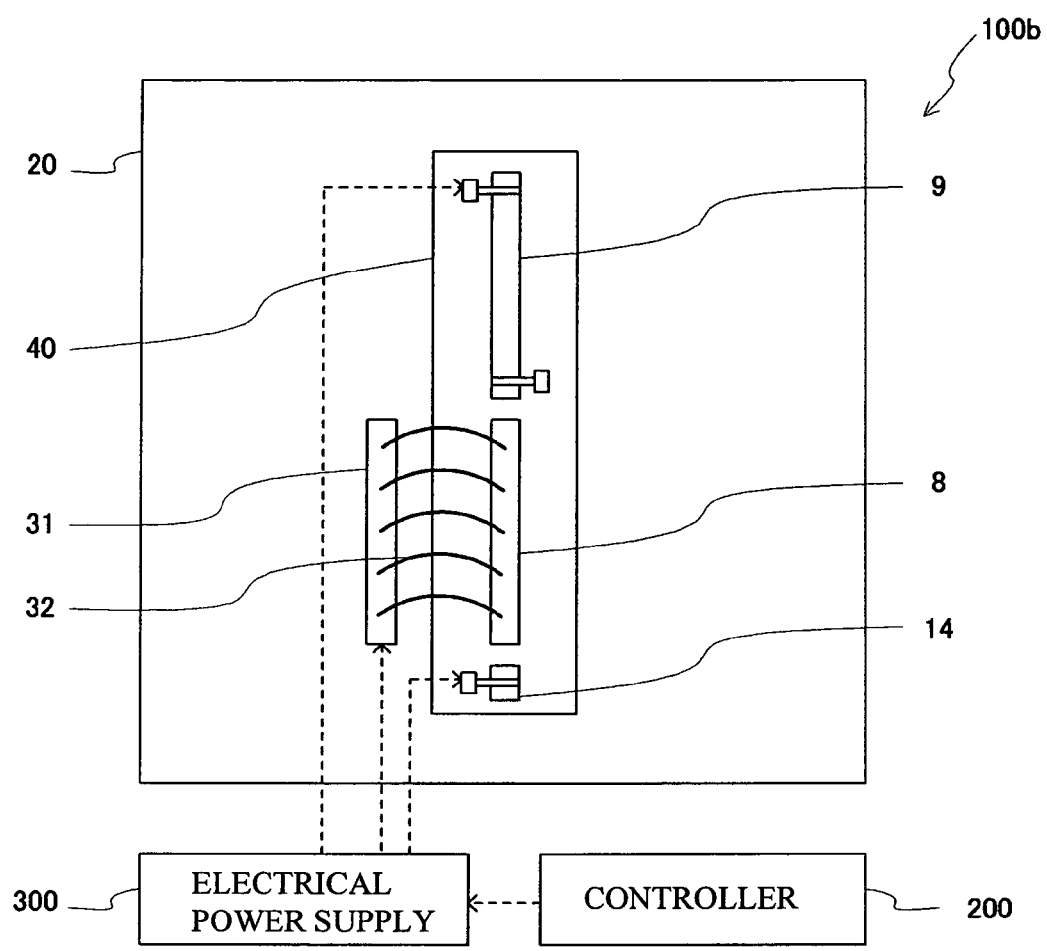
FIG. 3 illustrates an overall structure of a laser module in accordance with a third embodiment of the present invention.

Next, a description will be given of a laser module 100b in accordance with a third embodiment of the present invention. FIG. 3 illustrates an overall structure of the laser module 100b. As shown in FIG. 3, the laser module 100b differs from the laser module 100 shown in FIG. 1A and FIG. 1B in a point that the electrode 31 and the wavelength-tunable semiconductor laser chip 40 are mounted directly on the temperature control device 20 not through the mount carrier 30. The same components have the same reference numerals in order to avoid a duplicated explanation.

In the embodiment, the heat generated in the temperature control device 20 is conducted directly to the wavelength-tunable semiconductor laser chip 40. Further the heat is conducted directly to the electrode 31, and is conducted to the electrode 8 through the wires 32. And the temperature control device 20 can control the temperature of the optical waveguide layer 4 effectively.

Fourth Embodiment

Figure 4:
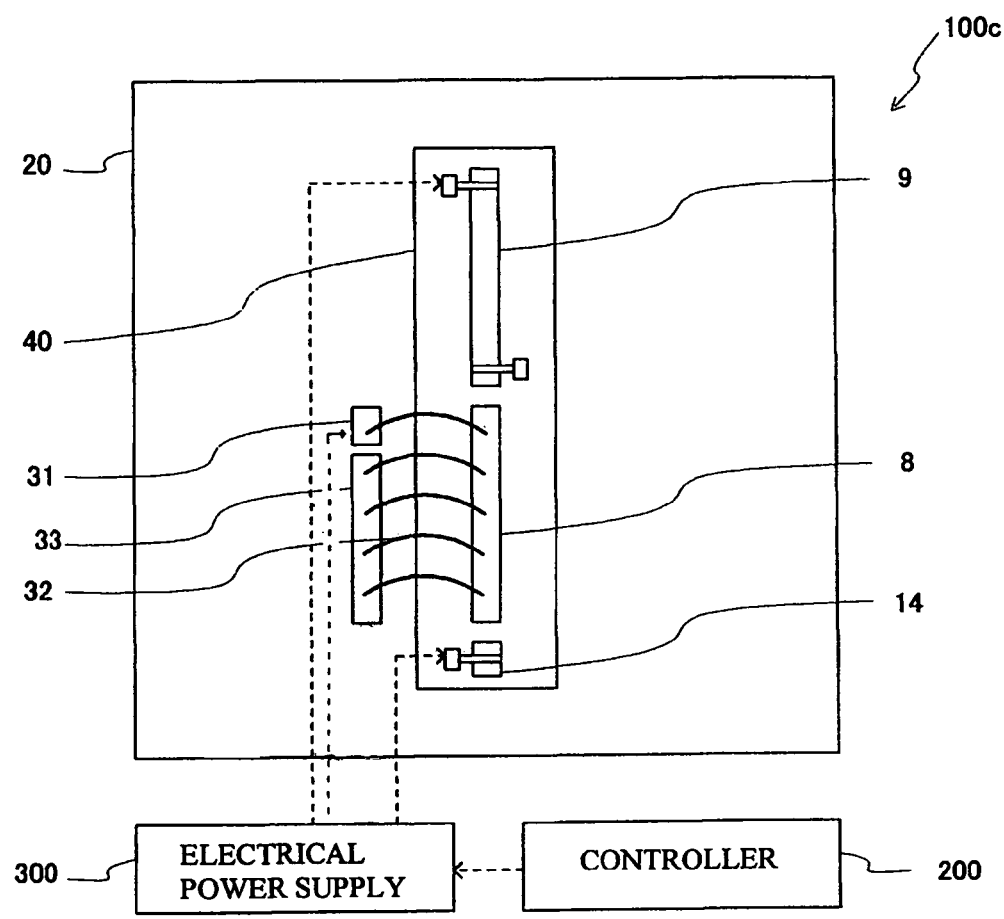
FIG. 4 illustrates an overall structure of a laser module in accordance with a fourth embodiment of the present invention.

Next, a description will be given of a laser module 100c in accordance with a fourth embodiment of the present invention. FIG. 4 illustrates an overall structure of the laser module 100c. As shown in FIG. 4, the laser module 100c differs from the laser module 100 shown in FIG. 1A and FIG. 1B in a point that the electrode 31 and the wavelength-tunable semiconductor laser chip 40 are mounted directly on the temperature control device 20 and the thermal conductive portion 33 is provided on the temperature control device 20. The same components have the same reference numerals in order to avoid a duplicated explanation.

In the embodiment, the heat generated in the temperature control device 20 is conducted directly to the wavelength-tunable semiconductor laser chip 40. Further the heat is conducted directly to the electrode 31 and the thermal conductive portion 33, and is conducted to the electrode 8 through the wires 32. And the temperature control device 20 can control the temperature of the optical waveguide layer 4 effectively.

Fifth Embodiment

Figure 5:
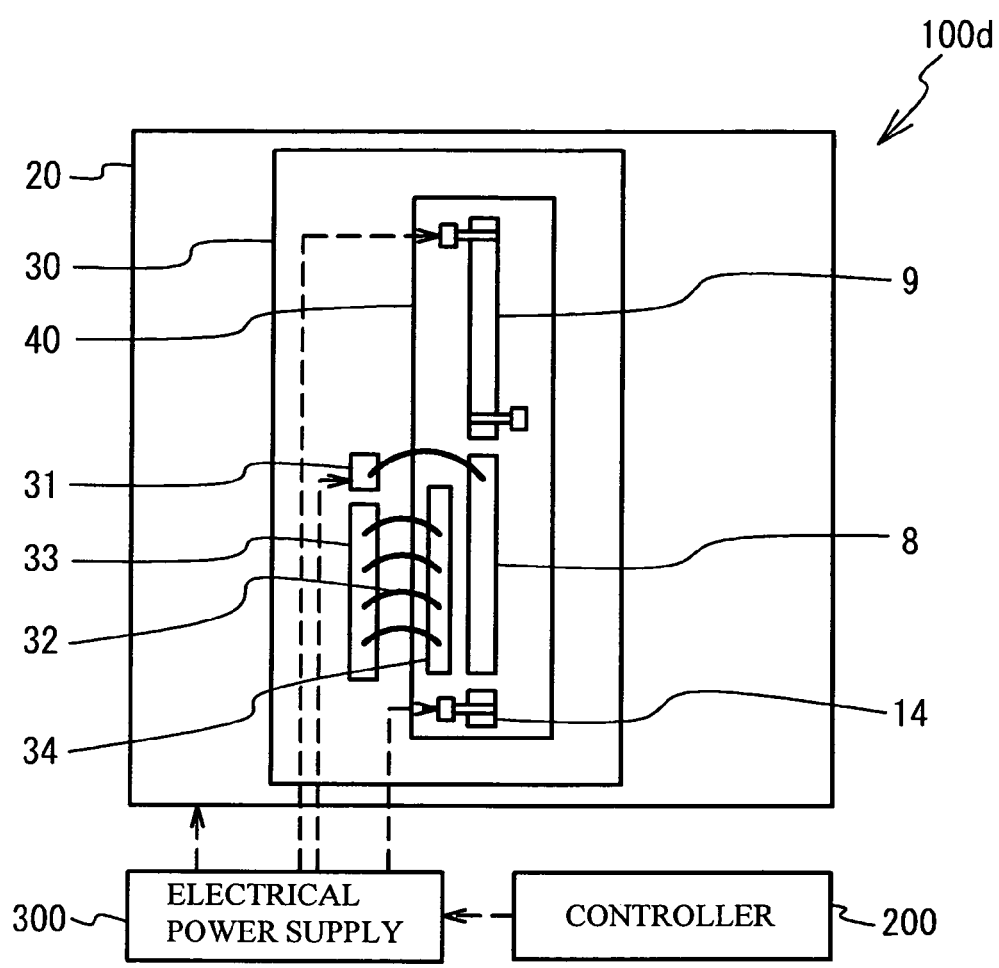
FIG. 5 illustrates an overall structure of a laser module in accordance with a fifth embodiment of the present invention.

Next, a description will be given of a laser module 100d in accordance with a fifth embodiment of the present invention. FIG. 5 illustrates an overall structure of the laser module 100d. As shown in FIG. 5, the laser module 100d differs from the laser module 100a shown in FIG. 2 in a point that a metal pattern 34 is provided on an upper face of the SG-DFB region B. The metal pattern 34 is electrically coupled to the optical waveguide layer 4. The metal pattern 34 is coupled to the thermal conductive portion 33 with one or more than one wire 32. The same components have the same reference numerals in order to avoid a duplicated explanation.

In the embodiment, heat is conducted to the metal pattern 34 from the thermal conductive portion 33 through the wires 32. And the temperature control device 20 can control the temperature of the optical waveguide layer 4 effectively. In the embodiment, the metal pattern 34 corresponds to the area electrically coupled to the first optical waveguide region.

Sixth Embodiment

Figure 6:
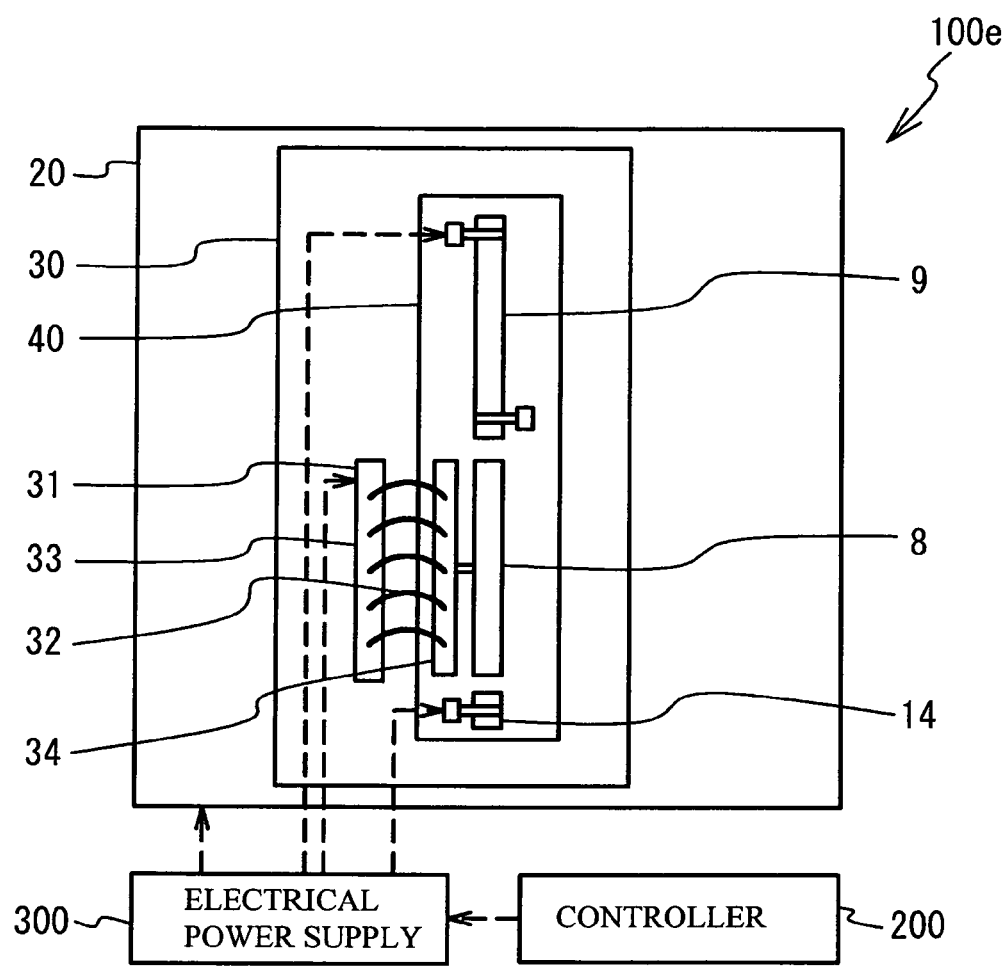
FIG. 6 illustrates an overall structure of a laser module in accordance with a sixth embodiment of the present invention.

Next, a description will be given of a laser module 100e in accordance with a sixth embodiment of the present invention. FIG. 6 illustrates an overall structure of the laser module 100e. As shown in FIG. 6, the laser module 100e is different from the laser module 100 shown in FIG. 1A and FIG. 1B in a point that the metal pattern 34 is provided on the upper face of the SG-DFB region B and is electrically conducted to the electrode 8. The metal pattern 34 is electrically coupled to the optical waveguide layer 4. The metal pattern 34 is coupled to the thermal conductive portion 33 with the wires 32. The same components have the same reference numerals in order to avoid a duplicated explanation.

In the embodiment, the metal pattern 34 has a length larger than half of that of the optical waveguide layer 4 in an optical axis direction of the optical waveguide layer 4. It is possible to provide heat to the optical waveguide layer 4 because the length of the metal pattern 34 is sufficiently large.

Seventh Embodiment

Figure 7:
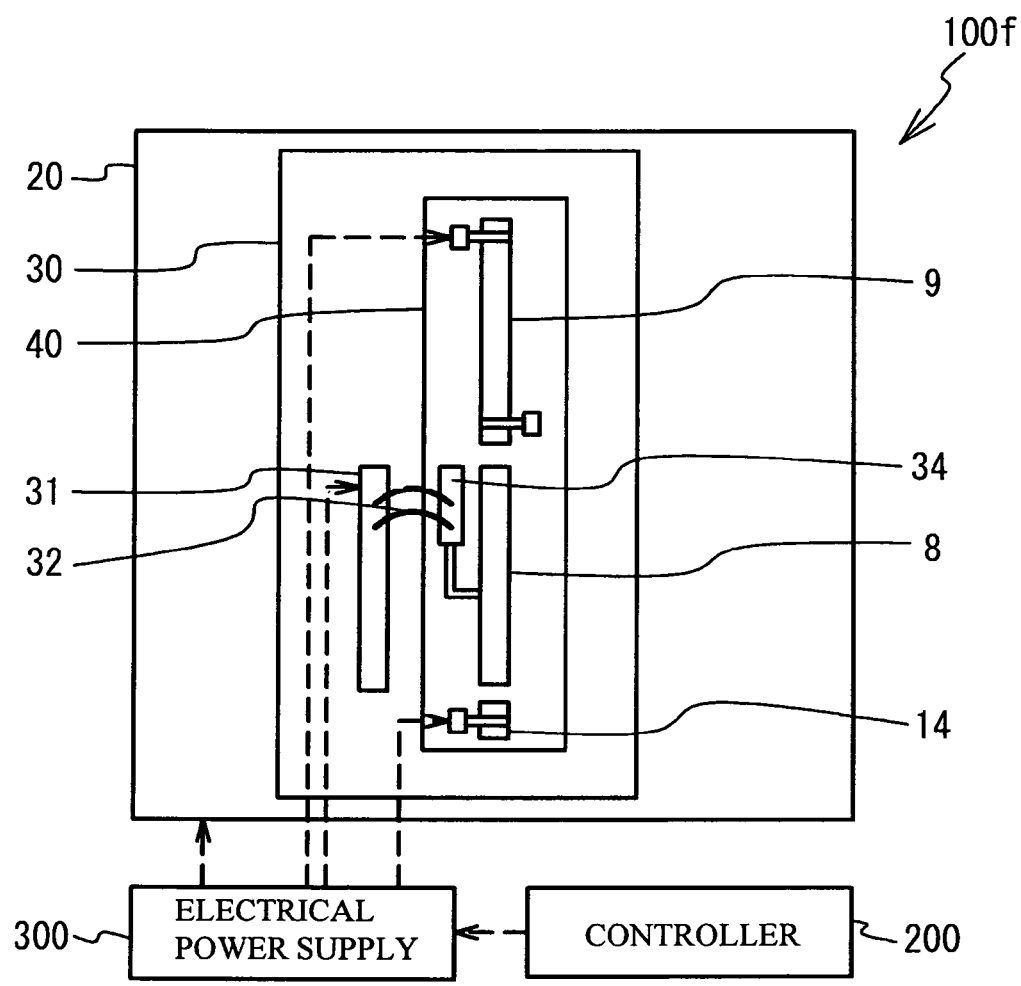
FIG. 7 illustrates an overall structure of a laser module in accordance with a seventh embodiment of the present invention.

A description will be given of a laser module 100f in accordance with a seventh embodiment of the present invention. FIG. 7 illustrates an overall structure of the laser module 100f. As shown in FIG. 7, the laser module 100f is different from the laser module 100e shown in FIG. 6 in a point that the metal pattern 34 is arranged at the optical waveguide layer 3 side with respect to a center of the optical waveguide layer 4. The same components have the same reference numerals in order to avoid a duplicated explanation. In this case, it is possible to control the temperature of an area that is subjected to the heat from the heater 9.

The optical semiconductor device in accordance with the present invention is not limited to the SG-DR region or the SG-DFB region, although the SG-DR region and the SG-DFB region are an example of the optical semiconductor device in the above embodiments. The present invention may be applied to other optical semiconductor device that has a heater controlling a temperature of an optical waveguide layer.

Figure 8:
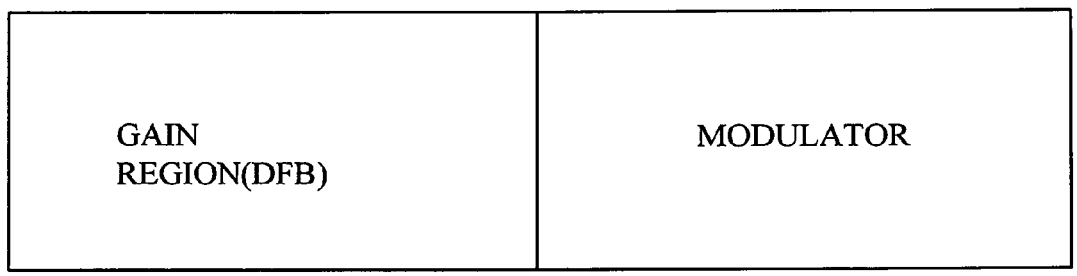
FIG. 8 illustrates an example where the present invention is applied to another optical semiconductor element.

FIG. 8 illustrates an example where the present invention is applied to a modulator. As shown in FIG. 8, it is possible to provide heat to an upper face of the modulator of an optical semiconductor element from a heating portion such as a temperature control device through a wire, the optical semiconductor element having a gain portion and the modulator, the gain portion having a heater on a surface thereof, the modulator not having a heater on a surface thereof.

While the above description constitutes the preferred embodiments of the present invention, it will be appreciated that the invention is susceptible of modification, variation and change without departing from the proper scope and fair meaning of the accompanying claims.

The present invention is based on Japanese Patent Application No. 2006-100351 filed on Mar. 31, 2006, the entire disclosure of which is hereby incorporated by reference.

What is claimed is:

1. An optical semiconductor device comprising:
    an optical semiconductor element that has a first optical waveguide region and a second optical waveguide region,
    the second optical waveguide region being optically coupled to the first optical waveguide region and having a heater for changing a refractive index of the second optical waveguide region;
    a metal pattern that is provided on an area to be thermally coupled to a temperature control device; and
    at least one thermal conductive material that couples the metal pattern with an upper face of the first optical waveguide region of the optical semiconductor element, the thermal conductive material being at the second optical waveguide region side with respect to a center of the first optical waveguide region.

2. The optical semiconductor element as claimed in claim 1, wherein the first optical waveguide region is a gain region or a modulator.

* * * * *